United States Patent
Skeete

(10) Patent No.: US 8,035,216 B2
(45) Date of Patent: Oct. 11, 2011

(54) INTEGRATED CIRCUIT PACKAGE AND METHOD OF MANUFACTURING SAME

(75) Inventor: Oswald L. Skeete, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 102 days.

(21) Appl. No.: 12/036,143

(22) Filed: Feb. 22, 2008

(65) Prior Publication Data
US 2009/0212416 A1    Aug. 27, 2009

(51) Int. Cl.
*H01L 23/48* (2006.01)
*H01L 21/58* (2006.01)

(52) U.S. Cl. ............ 257/698; 257/777; 257/E21.505; 257/E23.01; 438/106

(58) Field of Classification Search .......... 257/698, 257/777, 778, 724, 723, 686, E21.505, E23.01; 438/106
See application file for complete search history.

(56) References Cited

U.S. PATENT DOCUMENTS

| | | | |
|---|---|---|---|
| 5,353,498 A | 10/1994 | Fillion et al. | |
| 5,497,033 A | 3/1996 | Fillion et al. | |
| 5,527,741 A | 6/1996 | Cole et al. | |
| 5,841,193 A | 11/1998 | Eichelberger | |
| 5,939,728 A | 8/1999 | Wachtel et al. | |
| 6,150,724 A * | 11/2000 | Wenzel et al. | 257/777 |
| 6,154,366 A | 11/2000 | Ma et al. | |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |

(Continued)

FOREIGN PATENT DOCUMENTS
WO    2009/105367 A2    8/2009
(Continued)

OTHER PUBLICATIONS

Pending U.S. Appl. No. 11/860,922; Oswald Skeete, et al.; "Integrated Circuit Packages Including High Density Bump-Less Build Up Layers And A Lesser Density Core Or Coreless Substrate"; filed Sep. 25, 2007.

(Continued)

*Primary Examiner* — Victor A Mandala
*Assistant Examiner* — Whitney T Moore
(74) *Attorney, Agent, or Firm* — Kenneth A. Nelson

(57) ABSTRACT

Decoupling capacitors are frequently used in computer systems in order to control noise. In general, decoupling capacitors are placed as close as possible to the devices they protect in order to minimize the amount of line inductance and series resistance between the devices and the capacitors. An integrated circuit package includes a substrate (110, 210) having a first surface (111, 211) and an opposing second surface (112, 212), and a die platform (130, 230) adjacent to the first surface of the substrate. The substrate has a recess (120, 220) therein. The integrated circuit package further includes a capacitor (140, 240) in the recess of the substrate. The presence of a recess in the substrate provides an opportunity to reduce the separation distance between a die supported by the die platform and the decoupling capacitors. A further advantage of embodiments of the invention lies in its ability to maintain socket compatibility.

11 Claims, 3 Drawing Sheets

U.S. PATENT DOCUMENTS

| | | |
|---|---|---|
| 6,426,545 B1 | 7/2002 | Eichelberger et al. |
| 6,489,185 B1 | 12/2002 | Towle et al. |
| 6,489,686 B2 | 12/2002 | Farooq et al. |
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,160,755 B2 | 1/2007 | Lo et al. |
| 7,177,504 B2 * | 2/2007 | George et al. .......... 385/49 |
| 7,183,658 B2 | 2/2007 | Towle et al. |
| 7,189,596 B1 | 3/2007 | Mu et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,619,901 B2 | 11/2009 | Eichelberger et al. |
| 7,632,715 B2 | 12/2009 | Hess et al. |
| 7,648,858 B2 | 1/2010 | Tang et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 2008/0054448 A1 | 3/2008 | Lu et al. |
| 2008/0315377 A1 | 12/2008 | Eichelberger et al. |
| 2008/0315391 A1 | 12/2008 | Kohl et al. |
| 2009/0072382 A1 | 3/2009 | Guzek |
| 2009/0079063 A1 | 3/2009 | Chrysler et al. |
| 2009/0079064 A1 | 3/2009 | Tang et al. |
| 2009/0212416 A1 | 8/2009 | Skeete |
| 2009/0294942 A1 | 12/2009 | Palmer et al. |
| 2010/0044855 A1 | 2/2010 | Eichelberger et al. |
| 2010/0047970 A1 | 2/2010 | Eichelberger et al. |

FOREIGN PATENT DOCUMENTS

| | | |
|---|---|---|
| WO | 2009/105367 A3 | 10/2009 |

OTHER PUBLICATIONS

International Search Report and Written Opinion for PCT Patent Application No. PCT/US2009/033728, mailed on Sep. 14, 2009, 10 pages.

International Preliminary Report on Patentability and Written Opinion for PCT Patent Application No. PCT/US2009/033728, mailed on Sep. 2, 2010, 5 pages.

Pending U.S. Appl. No. 12/655,321; John Guzek; "Recessed and Embedded Die Coreless Package"; filed Dec. 29, 2009.

Pending U.S. Appl. No. 12/590,350; Ravi K. Nalla et al.; "Microelectronic Package and Method of Manufacturing Same"; filed Nov. 6, 2009.

Pending U.S. Appl. No. 12/655,335; John Stephen Guzek et al.; "Semiconductor Package with Embedded Die and its Methods of Fabrication"; filed Dec. 29, 2009.

Pending U.S. Appl. No. 12/761,782; Ravi K. Nalla et al.; "Forming Functionalized Carrier Structures with Coreless Packages"; filed Apr. 16, 2010.

Pending U.S. Appl. No. 12/755,183; Ravi K. Nalla et al.; "Forming In-Situ Micro-Feature Structures with Coreless Packages"; filed Apr. 6, 2010.

Pending U.S. Appl. No. 12/755,201; Ravi K. Nalla et al.; "Forming Metal Filled Die Back-Side Film For Electromagnetic Interference Shielding With Coreless Packages"; filed Apr. 6, 2010.

Pending U.S. Appl. No. 12/725,925; John S. Guzek et al.; "System-in-Package Using Embedded-Die Coreless Substrates and Processes of Forming Same"; filed Mar. 17, 2010.

Pending U.S. Appl. No. 12/753,637; Robert L. Sankman et al.; "Embedded Semiconductive Chips in Reconstituted Wafers, and Systems Containing Same"; filed Apr. 2, 2010.

Pending U.S. Appl. No. 09/640,961; Harry H. Fujimoto et al.; "Direct Build-Up Layer on an Encapsulated Die Package"; filed Aug. 16, 2000.

* cited by examiner

INTEGRATED CIRCUIT PACKAGE AND METHOD OF MANUFACTURING SAME

FIELD OF THE INVENTION

The disclosed embodiments of the invention relate generally to integrated circuit packaging, and relate more particularly to power delivery schemes for such packages.

BACKGROUND OF THE INVENTION

A modern integrated circuit contains large numbers of semiconductor devices, including, potentially, millions of transistors that switch on and off very rapidly. That switching of transistors creates high frequency noise, and this must be controlled in order to create the noise-free, stable power delivery system required by high speed computing environments. Decoupling capacitors (also referred to as bypass capacitors) are frequently used in such systems to control noise, for example by shorting the noise to ground. Often hundreds of decoupling capacitors will be used in order to offset the effects of the transistor noise, and their placement is an important design element both for electrical performance as well as for power testing purposes.

In general, decoupling capacitors are placed as close as possible to the devices they protect in order to minimize the amount of line inductance and series resistance between the devices and the capacitors. In existing packages, power delivery options include placing capacitors on the land side and/or on the die side of the package. It is perhaps most typical for capacitors to be placed on the land side, where they are separated from the die by the thickness of the substrate and the die/substrate interconnects.

BRIEF DESCRIPTION OF THE DRAWINGS

The disclosed embodiments will be better understood from a reading of the following detailed description, taken in conjunction with the accompanying figures in the drawings in which.

Figure 1:
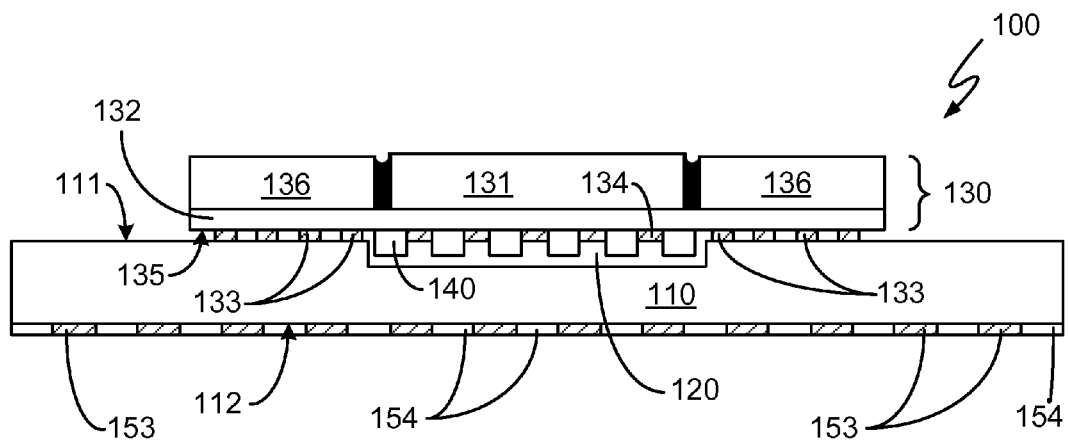
FIG. 1 is a cross-sectional view of an integrated circuit package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, an integrated circuit package comprises a substrate having a first surface and an opposing second surface, and a die platform adjacent to the first surface of the substrate. The substrate has a recess therein. The integrated circuit package further comprises a capacitor (or other component) in the recess of the substrate. (Although this document focuses almost exclusively on capacitors as the component in the substrate recess it should be understood that other components, such as thin film arrays and the like (as limited by size) may also be used, and what is said herein regarding capacitors also applies to such other components, with appropriate modifications as will be apparent to those of ordinary skill in the art.)

The presence of a recess in the substrate provides an opportunity to reduce the separation distance between a die supported by the die platform and the decoupling capacitors. Large separation distances reduce clocking frequencies and create noise. Thus, embodiments of the invention may enhance electrical performance, by minimizing line inductance and series resistance, while preserving or enabling various interconnect options, both between die platform and substrate and between substrate and a printed circuit board or other next level device.

As an example, embodiments of the invention allow capacitor placement to be optimized for best electrical performance by placing capacitors much closer to the die than is possible in current packages, which in turn reduces the number of capacitors needed, therefore reducing cost and size.

Furthermore, if required, capacitors can be depopulated much more easily than with a scheme where capacitors are embedded in the substrate.

A further advantage of embodiments of the invention lies in its ability to maintain socket compatibility. A low-density or other first portion of the package may be designed to fit existing motherboards while a high-density or other second portion may be designed more aggressively. With this approach, even as package sizes are reduced at the die platform level the motherboard industry is not forced to move at the same pace. As an example, leading-edge specifications may be incorporated into the die platform portion while preserving the ability to simply attach that portion to the low density portion in any form factor desired and maintain socket compatibility for the integrated circuit package as a whole.

Referring now to the drawings, FIG. 1 is a cross-sectional view of an integrated circuit package 100 according to an embodiment of the invention. As illustrated in FIG. 1, integrated circuit package 100 comprises a substrate 110 having a surface 111 and an opposing surface 112 and containing a recess 120. In the embodiment illustrated in FIG. 1, recess 120 is in surface 111. Integrated circuit package 100 further comprises a die platform 130 adjacent to surface 111 of substrate 110 and a capacitor 140 in recess 120. Also in recess 120 is solder resist 134.

FIG. 1 depicts a total of six capacitors in recess 120, but nothing in this description should be understood as limiting the number of capacitors to one or to six or indeed to any particular number. Rather, any suitable number of capacitors may be located in recess 120 according to various embodiments of the invention, as indicated or required by design parameters, desired electrical performance, or other factors. Accordingly, references herein to capacitor 140 should be understood to apply to all capacitors similarly situated unless otherwise indicated.

As illustrated in FIG. 1, die platform 130 comprises a bumpless build-up layer (BBUL) component comprising a die 131, a plurality of build-up layers 132 adjacent to die 131, and a plurality of interconnect structures 133 adjacent to build-up layers 132. Build-up layers 132 are shown in greater detail in FIG. 4. Die platform 130 further comprises insulating core material 136, which gives die platform 130 its rigidity, defines the package size, and provides space for fan out of the interconnects from die 131. Die platform 130 is electrically and physically coupled to substrate 110 using interconnect structures 133. It is noted here that in the embodiment of FIG. 1 integrated circuit package 100 is a hybrid BBUL package, with the BBUL component (die platform 130) being a higher density interconnect routing element and substrate 110 being a lower density interconnect routing element of such hybrid BBUL package. It is further noted that other embodiments of the invention may use other hybrid high-density/low density packaging types, or packaging types of other kinds, any of which may, for example, be suitable for maintaining socket compatibility (among other possible advantages).

With recess 120 in surface 111 of substrate 110, capacitor 140 may be physically attached to die platform 130 as shown in FIG. 1. As an example, the physical attachment may be accomplished using soldering techniques or the like. This configuration permits a very small separation distance between capacitor 140 and die 131—much smaller than existing packages in which capacitor and die are separated by the thickness of the substrate and the die/substrate interconnects. This smallest possible separation distance between die 131 and capacitor 140 provides the greatest electrical performance benefit for a given capacitance. Additionally, the number of capacitors, and hence the capacitance value, may be reduced while still maintaining the same performance as a higher-capacitance system with larger separation distances.

Furthermore, since capacitor 140 need not be placed on surface 112 of substrate 110, where it would have been placed in earlier integrated circuit packages, this configuration permits a full array of lands or other interconnects on surface 112 of substrate 110 in which substantially all of surface 112 is covered with interconnect structures 153. Regions of solder resist 154 left over from manufacturing processes lie between each adjacent pair of interconnect structures 153. It should be noted that the phrase "substantially all" used in this and similar contexts herein does not necessarily mean that substantially all of the surface is covered with interconnects. Rather, as here, it may mean only that the combination of interconnects and intervening features (e.g., solder resist) covers substantially all of the surface.

Interconnect structures 153 enable electrical and/or physical connection to a printed circuit board or other next level device. A full land grid array (or a full array of interconnects of other kinds such as ball grid arrays and pin grid arrays) maximizes the number of input/output points at substrate 110 (e.g., the number of pin-outs to a motherboard or the like), thus offering advantages in terms of package size, electrical connection, and signal propagation.

Recess 120 is designed so as to accommodate capacitor 140 and to avoid mechanical interference during or after the attachment of die platform 130 and substrate 110. For example, capacitor 140 must be able to rest in recess 120 while interconnect structures 133 contact build-up layers 132 and surface 111 of substrate 110. If recess 120 is too shallow (i.e., its magnitude in the z-dimension is too small), mechanical interference between capacitor 140 and the floor of recess 120 will prevent such contact. At the same time, recess 120 must be properly sized in the x- and y-dimensions in order to prevent alignment problems. In that regard, the tolerance must be great enough to once again allow capacitor 140 to be placed into recess 120 without interfering with the sidewalls of recess 120.

Referring still to FIG. 1, plurality of interconnect structures 133 are located at a surface 135 of die platform 130, which in the illustrated embodiment is a lower surface of build-up layers 132. As shown, plurality of interconnect structures 133 form an array (e.g., a BBUL grid array) that covers a portion of surface 135, though because of the presence of recess 120, that portion is less than all of surface 135. Interconnect structures 133 may thus be thought of as forming a partial array at surface 135.

Figure 2:
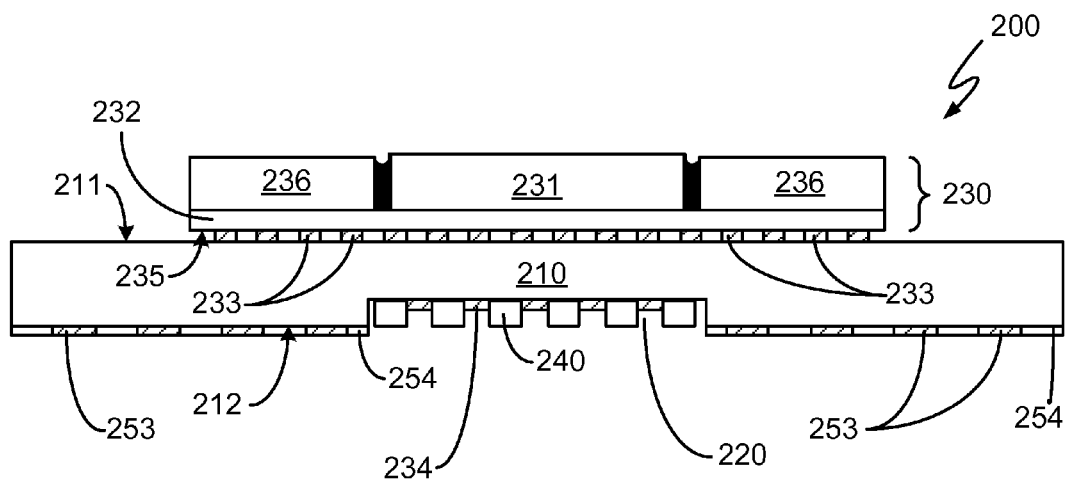
FIG. 2 is a cross-sectional view of an integrated circuit package according to another embodiment of the invention.

FIG. 2 is a cross-sectional view of an integrated circuit package 200 according to an embodiment of the invention. As illustrated in FIG. 2, integrated circuit package 200 comprises a substrate 210 having a surface 211 and an opposing surface 212 and containing a recess 220. In the embodiment illustrated in FIG. 2, recess 220 is in surface 212. Various design considerations, including size constraints, manufacturing concerns, and the like, influence the placement of the recess, whether in surface 212, as here, or in surface 111, as in FIG. 1. A possible advantage, not mentioned above, of the FIG. 1 embodiment over the FIG. 2 embodiment is that a BBUL component standing alone may be subjected to a full battery of testing, including both structural and functional tests, provided it has capacitors in place, as the FIG. 1 embodiment does. A BBUL component without the substrate would also be advantageous in small form factor environments.

Integrated circuit package 200 further comprises a die platform 230 adjacent to surface 211 of substrate 210 and a capacitor 240 in recess 220. Also in recess 220 is solder resist 234. As an example, substrate 210, surface 211, surface 212, recess 220, die platform 230, solder resist 234, and capacitor 240 can be similar to, respectively, substrate 110, surface 111, surface 112, recess 120, die platform 130, solder resist 134, and capacitor 140, all of which are shown in FIG. 1. FIG. 2 depicts a total of six capacitors in recess 220, but, as was the case with integrated circuit package 100 shown in FIG. 1, nothing in this description should be understood as limiting the number of capacitors to a particular number. Rather, any suitable number of capacitors may be located in recess 220 according to various embodiments of the invention, as indicated or required by design parameters, desired electrical performance, or other factors. Accordingly, references herein to capacitor 240 should be understood to apply to all capacitors similarly situated unless otherwise indicated.

As illustrated in FIG. 2, die platform 230 comprises a BBUL component comprising a die 231, a plurality of build-up layers 232 adjacent to die 231, and a plurality of interconnect structures 233 adjacent to build-up layers 232. Die platform 230 further comprises core material 236. As an example, die 231, build-up layers 232, interconnect structures 233, and core material 236 can be similar to, respectively, die 131, build-up layers 132, interconnect structures 133, and core material 136, all of which are shown in FIG. 1. Die platform 230 is electrically and physically coupled to substrate 210 using interconnect structures 233.

Plurality of interconnect structures 233 are located at a surface 235 of die platform 230, which in the illustrated embodiment is a lower surface of build-up layers 232. With recess 220 located on the land side of substrate 210, interconnect structures 233 form an array that covers substantially all of surface 235 of die platform 230. In the illustrated embodiment, interconnect structures 233 form a full BBUL grid array for interconnection with substrate 210 while still providing a shorter electrical path (i.e., a smaller separation distance) between capacitor 240 and die 231. Advantages of such smaller separation distances and of full grid arrays have been discussed above. The full BBUL grid array covers substantially all of surface 235, as shown.

A portion of surface 212 of substrate 210 is covered with an array of interconnect structures 253, which physically and/or electrically connect substrate 210 to a printed circuit board or other next level device. Regions of solder resist 254 left over from manufacturing processes lie between each adjacent pair of interconnect structures 253. As was true of interconnect structures 153 (see FIG. 1), interconnect structures 253 may comprise lands, balls, pins, or the like.

Figure 3:
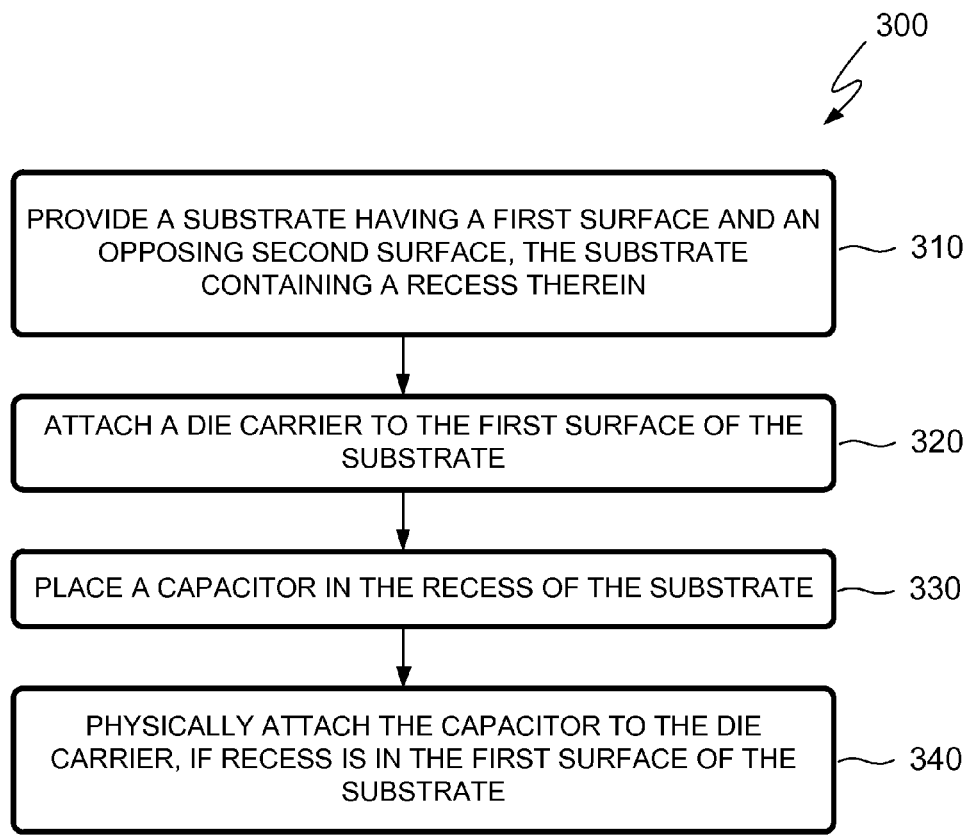
FIG. 3 is a flowchart illustrating a method of manufacturing an integrated circuit package according to an embodiment of the invention.

FIG. 3 is a flowchart illustrating a method 300 of manufacturing an integrated circuit package according to an embodiment of the invention. A step 310 of method 300 is to provide a substrate having a first surface and an opposing second surface, the substrate containing a recess therein. As an example, the substrate, the first surface, and the second surface can be similar to, respectively, substrate 110, surface 111, and surface 112, all of which are shown in FIG. 1. As another example, the recess can be similar to recess 120, also shown in FIG. 1.

In one embodiment, step 310 comprises providing a substrate with the recess in the first surface, making it similar to integrated circuit package 100 shown in FIG. 1. In another embodiment, step 310 comprises providing a substrate with the recess in the second surface, making it similar to integrated circuit package 200 shown in FIG. 2.

A step 320 of method 300 is to attach a die platform to the first surface of the substrate. As an example, the die platform can be similar to die platform 130 that is shown in FIG. 1. In one embodiment, step 320 comprises attaching a bumpless build-up layer component that comprises a die, a plurality of build-up layers adjacent to the die, and a plurality of interconnect structures adjacent to the build-up layers. As an example, the die, the build-up layers, and the interconnect structures can be similar to, respectively, die 131, build-up layers 132, and interconnect structures 133, all of which are shown in FIG. 1.

In at least some embodiments where the recess is located in the first surface of the substrate, step 320 results in substantially all of the second surface of the substrate being covered with an array of interconnect structures. Such structures may include land grid arrays, ball grid arrays, pin grid arrays, and the like as discussed above.

In at least some embodiments where the recess is located in the second surface of the substrate, step 320 results in a plurality of interconnect structures (such as a BBUL grid array or the like) that form an array covering substantially all of a first surface of the die platform.

A step 330 of method 300 is to place a capacitor in the recess of the substrate. As an example, the capacitor can be similar to capacitor 140 that is shown in FIG. 1.

A step 340 of method 300 is to physically attach the capacitor to the die platform. This step may be performed in embodiments where the recess is in the first surface of the substrate, as explained above.

Figure 4:
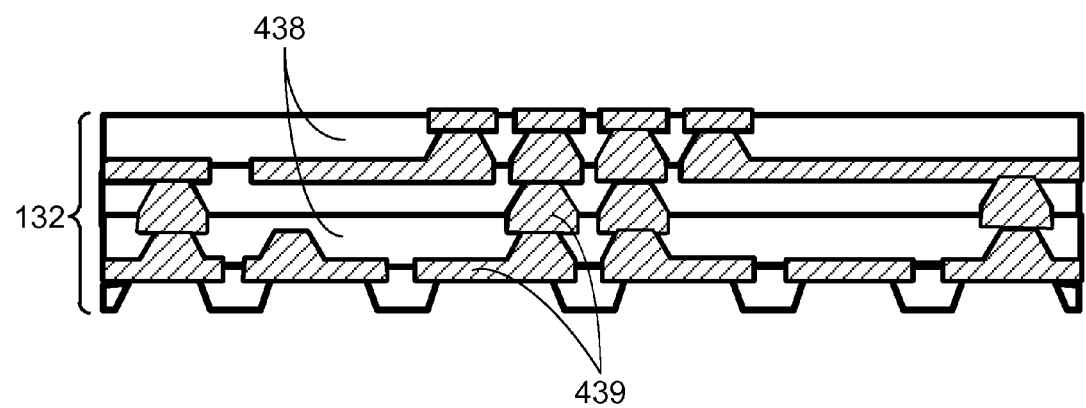
FIG. 4 is a cross-sectional view of the integrated circuit package of FIG. 1 showing additional build-up layer detail according to an embodiment of the invention.

FIG. 4 is a cross-sectional view of build-up layers 132 showing more detail than was visible in FIG. 1. As illustrated in FIG. 4, build-up layers 132 include dielectric layers 438 and electrically conductive layers 439.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the integrated circuit package and related methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An integrated circuit package comprising:
    a substrate having a first surface and an opposing second surface, the second surface having a first array of interconnect structures and containing a recess therein;
    a die platform outside of the recess and adjacent to the first surface of the substrate, wherein the die platform comprises a bumpless build-up layer component comprising:
        a die;

a plurality of build-up layers attached directly to the die without the use of intervening connection bumps; and a second array of interconnect structures adjacent to the build-up layers; and a capacitor in the recess of the substrate, wherein the first array of interconnect structures has a density lower than that of the second array of interconnect structures.

2. The integrated circuit package of claim 1 wherein:

the capacitor is physically attached to the die platform.

3. The integrated circuit package of claim 2 wherein:

substantially all of the second surface of the substrate is covered with the first array of interconnect structures.

4. The integrated circuit package of claim 3 wherein:

the second array of interconnect structures is located at a first surface of the die platform; and the second array of interconnect structures covers a portion of the first surface of the die platform.

5. The integrated circuit package of claim 1 wherein:

the second array of interconnect structures is located at a first surface of the die platform; and the second array of interconnect structures covers substantially all of the first surface of the die platform.

6. An integrated circuit package comprising:

a substrate having a first surface and an opposing second surface, the second surface containing a recess therein and the second surface having an array of interconnect structures;

a bumpless build-up layer component outside of the recess and physically and electrically coupled to the first surface of the substrate, the bumpless build-up layer component comprising:

a die;

a plurality of build-up layers attached directly to the die without the use of intervening connection bumps; and a bumpless build-up layer grid array located at a first surface of the bumpless build-up layer component and covering substantially all of the first surface of the bumpless build-up layer component; and a plurality of capacitors in the recess of the substrate, wherein the array of interconnect structures has a density lower than that of the bumpless build-up layer grid array.

7. The integrated circuit package of claim 6 wherein: the plurality of capacitors are physically attached to the bumpless build-up layer component.

8. The integrated circuit package of claim 7 wherein:

substantially all of the second surface of the substrate is covered with the array of interconnect structures.

9. A method of manufacturing an integrated circuit package, the method comprising:

providing a substrate having a first surface and an opposing second surface, the second surface containing a recess therein, the second surface having a first array of interconnect structures;

attaching a die platform to the first surface of the substrate outside of the recess; and placing a capacitor in the recess of the substrate, wherein:

attaching the die platform comprises attaching a bumpless build-up layer component that comprises:

a die;

a plurality of build-up layers attached directly to the die without the use of intervening connection bumps; and a second array of interconnect structures adjacent to the build-up layers; and the first array of interconnect structures has a density lower than that of the second array of interconnect structures.

10. The method of claim 9 further comprising:

physically attaching the capacitor to the die platform.

11. The method of claim 10 wherein:

substantially all of the second surface of the substrate is covered with the first array of interconnect structures.

* * * * *